(12) United States Patent
Lee et al.

(10) Patent No.: US 10,446,570 B2
(45) Date of Patent: Oct. 15, 2019

(54) SEMICONDUCTOR MEMORY DEVICE

(71) Applicant: SK hynix Inc., Gyeonggi-do (KR)

(72) Inventors: Go-Hyun Lee, Gyeonggi-do (KR); Jae-Taek Kim, Seoul (KR); Jun-Youp Kim, Gyeonggi-do (KR); Chang-Man Son, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/988,346

(22) Filed: May 24, 2018

(65) Prior Publication Data

US 2019/0139976 A1 May 9, 2019

(30) Foreign Application Priority Data

Nov. 8, 2017 (KR) .................. 10-2017-0147873

(51) Int. Cl.
*H01L 23/52* (2006.01)
*H01L 27/11573* (2017.01)
*G11C 16/08* (2006.01)
*H01L 27/1157* (2017.01)
*H01L 27/11582* (2017.01)
*H01L 23/00* (2006.01)
*H01L 27/108* (2006.01)

(52) U.S. Cl.
CPC ........ *H01L 27/11573* (2013.01); *G11C 16/08* (2013.01); *H01L 27/1157* (2013.01); *H01L 27/11582* (2013.01); *H01L 23/562* (2013.01); *H01L 23/564* (2013.01); *H01L 27/10897* (2013.01)

(58) Field of Classification Search
CPC ................. H01L 23/562; H01L 23/564; H01L 27/11573; H01L 27/10897
See application file for complete search history.

(56) References Cited

U.S. PATENT DOCUMENTS

| 7,002,239 B1 * | 2/2006 | Nadarajah ......... H01L 23/49541 257/666 |
| 7,208,790 B2 * | 4/2007 | Arai ...................... H01L 27/105 257/296 |
| 7,960,844 B2 * | 6/2011 | Jang .................. H01L 27/11524 257/777 |

(Continued)

FOREIGN PATENT DOCUMENTS

KR 1020160136919 11/2016
KR 1020170061247 6/2017

*Primary Examiner* — Nicholas J Tobergte
(74) *Attorney, Agent, or Firm* — IP & T Group LLP

(57) ABSTRACT

A semiconductor memory device includes a peripheral circuit region including a first substrate, a peripheral circuit element disposed at least partially over the first substrate, a first dielectric layer covering the peripheral circuit element and a bottom wiring line disposed in the first dielectric layer and electrically coupled to the peripheral circuit element; a cell region including a second substrate disposed over the first dielectric layer, a memory cell array disposed over the second substrate; a second dielectric layer covering the memory cell array; a contact coupled to the bottom wiring line by passing through the second dielectric layer and the first dielectric layer in a first direction perpendicular to a top surface of the second substrate; and at least one dummy contact disposed adjacent to the contact in the second dielectric layer.

20 Claims, 28 Drawing Sheets

(56) References Cited

U.S. PATENT DOCUMENTS

| | | | | |
|---|---|---|---|---|
| 8,013,383 B2* | 9/2011 | Kidoh | ............... | H01L 27/0688 |
| | | | | 257/324 |
| 8,822,285 B2* | 9/2014 | Hwang | ............... | H01L 23/5283 |
| | | | | 257/324 |
| 9,425,208 B2* | 8/2016 | Kim | ............... | H01L 27/11582 |
| 9,484,355 B2* | 11/2016 | Jung | ............... | H01L 27/11575 |
| 2015/0372005 A1* | 12/2015 | Yon | ............... | H01L 27/11582 |
| | | | | 257/5 |
| 2016/0027796 A1* | 1/2016 | Yang | ............... | H01L 27/11573 |
| | | | | 257/314 |
| 2019/0035733 A1* | 1/2019 | Park | ............... | H01L 23/535 |

* cited by examiner

SEMICONDUCTOR MEMORY DEVICE

CROSS-REFERENCE TO RELATED APPLICATION

The present application claims priority to Korean Patent Application No. 10-2017-0147873 filed on Nov. 8, 2017, which is incorporated herein by reference in its entirety.

BACKGROUND

1. Technical Field

Various embodiments generally relate to a semiconductor memory device and, more particularly, to a three-dimensional semiconductor memory device.

2. Related Art

As efforts for improving the degree of integration of a semiconductor memory device with a two-dimensional structure in which memory cells are formed in a single layer on a substrate reach a limit, a semiconductor memory device with a three-dimensional structure in which memory cells are disposed in a direction perpendicular to the top surface of a substrate to improve the degree of integration has been suggested.

SUMMARY

In an embodiment, a semiconductor memory device may include a peripheral circuit region and a cell region which is disposed over the peripheral circuit region. The peripheral circuit region may include a first substrate, a peripheral circuit element disposed at least partially over the first substrate, a first dielectric layer covering the peripheral circuit element and a bottom wiring line disposed in the first dielectric layer and electrically coupled to the peripheral circuit elements. The cell region may include a second substrate disposed over the first dielectric layer, a memory cell array disposed over the second substrate and a second dielectric layer covering the memory cell array. The semiconductor memory device in accordance with the embodiment may include a contact coupled to the bottom wiring line by passing through the second dielectric layer and the first dielectric layer in a first direction perpendicular to a top surface of the second substrate; and at least one dummy contact disposed adjacent to the contact in the second dielectric layer.

In an embodiment, a semiconductor memory device may include a peripheral circuit region and a cell region which is disposed over the peripheral circuit region. The peripheral circuit region may include a first substrate, peripheral circuit elements which are disposed over the first substrate, a first dielectric layer which covers the peripheral circuit elements and a bottom wiring line which is disposed in the first dielectric layer and is electrically coupled to the peripheral circuit elements. The cell region may include a second substrate and an etch stopper which are disposed over the first dielectric layer, channel structures which extend in a first direction perpendicular to a top surface of the second substrate, a plurality of gate electrode layers and a plurality of interlayer dielectric layers which are alternately stacked over the second substrate to be adjacent to the channel structures and a second dielectric layer which covers the gate electrode layers. The semiconductor memory device in accordance with the embodiment may include a contact coupled to the bottom wiring line by passing through the second dielectric layer and the first dielectric layer in the first direction; and a plurality of dummy contacts coupled to the etch stopper by passing through the second dielectric layer in the first direction, and disposed adjacent to the contact.

In an embodiment, a semiconductor memory device may include a first substrate, a peripheral circuit element disposed at least partially over the first substrate, a first dielectric layer covering the peripheral circuit element, a wiring line disposed in the first dielectric layer and electrically coupled to the peripheral circuit element, a second substrate disposed over the first dielectric layer, a second dielectric layer disposed over the second substrate, a contact coupled to the wiring line by passing through the second dielectric layer and the first dielectric layer in a first direction perpendicular to a top surface of the second substrate, and at least one dummy contact disposed adjacent to the contact in the second dielectric layer.

In an embodiment, a memory system comprises a semiconductor memory device, and a controller operatively coupled to the semiconductor memory device. A semiconductor memory device may include a peripheral circuit region and a cell region which is disposed over the peripheral circuit region. The peripheral circuit region may include a first substrate, a peripheral circuit element disposed at least partially over the first substrate, a first dielectric layer covering the peripheral circuit element and a bottom wiring line disposed in the first dielectric layer and electrically coupled to the peripheral circuit elements. The cell region may include a second substrate disposed over the first dielectric layer, a memory cell array disposed over the second substrate and a second dielectric layer covering the memory cell array. The semiconductor memory device in accordance with the embodiment may include a contact coupled to the bottom wiring line by passing through the second dielectric layer and the first dielectric layer in a first direction perpendicular to a top surface of the second substrate; and at least one dummy contact disposed adjacent to the contact in the second dielectric layer.

In an embodiment, a semiconductor memory system comprises a semiconductor memory device suitable for storing data; and a controller operably coupled to the semiconductor device. The semiconductor device comprises a first substrate, a peripheral circuit element disposed at least partially over the first substrate, a first dielectric layer covering the peripheral circuit element, a wiring line disposed in the first dielectric layer and electrically coupled to the peripheral circuit element, a second substrate disposed over the first dielectric layer, a second dielectric layer disposed over the second substrate, a contact coupled to the wiring line by passing through the second dielectric layer and the first dielectric layer in a first direction perpendicular to a top surface of the second substrate, and at least one dummy contact disposed adjacent to the contact in the second dielectric layer.

These and other features and advantages of the present invention will become apparent to those skilled in the art of the invention from the following detailed description of preferred embodiments in conjunction with the accompanying drawings.

DETAILED DESCRIPTION

Hereinafter, a semiconductor memory device will be described below with reference to the accompanying drawings through various examples of embodiments.

Figure 1:
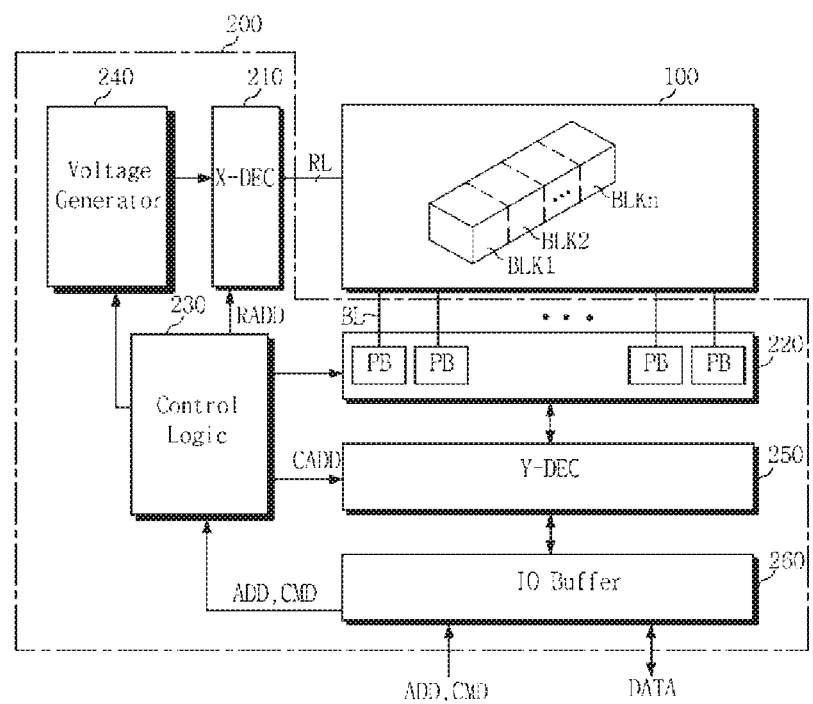
FIG. 1 is a block diagram illustrating a representation of an example of a semiconductor memory device in accordance with an embodiment of the present invention.

FIG. 1 is a block diagram illustrating a representation of an example of a semiconductor memory device in accordance with an embodiment of the present invention.

Referring to FIG. 1, the semiconductor memory device in accordance with the embodiment may include a memory cell array 100 and a peripheral circuit 200. The peripheral circuit 200 may include a row decoder 210, a page buffer circuit 220, a control logic 230, a voltage generator 240, a column decoder 250 and an input/output buffer 260.

The memory cell array 100 may include a plurality of memory blocks BLK1 to BLKn. Each of the memory blocks BLK1 to BLKn may include a plurality of cell strings. Each of the cell strings may include a plurality of memory cells which are stacked on a substrate. The memory cells may be nonvolatile memory cells.

The memory cell array 100 may be coupled to the row decoder 210 through row lines RL. The row lines RL may include at least one drain select line, a plurality of word lines and at least one source select line. The memory cell array 100 may be coupled to the page buffer circuit 220 through bit lines BL. The row lines RL may be coupled to the respective memory blocks BLK1 to BLKn. The bit lines BL may be coupled in common to the plurality of memory blocks BLK1 to BLKn.

The row decoder 210 may select any one among the memory blocks BLK1 to BLKn of the memory cell array 100, in response to a row address RADD provided from the control logic 230. The row decoder 210 may transfer operation voltages from the voltage generator 240, for example, a program voltage (Vpgm), a pass voltage (Vpass) and a read voltage (Vread), to the row lines RL coupled to a selected memory block.

The page buffer circuit 220 may include a plurality of page buffers PB which are coupled to the memory cell array 100 through the bit lines BL. The page buffers PB may operate as write drivers or sense amplifiers depending on an operation mode. In a program operation, the page buffers PB may latch data DATA received through the input/output buffer 260 and the column decoder 250 and apply voltages necessary for storing the data DATA in selected memory cells, to the bit lines BL in response to a control signal from the control logic 230. In a read operation, the page buffers PB may read data DATA stored in selected memory cells, through the bit lines BL and output the read data DATA to an exterior through the column decoder 250 and the input/output buffer 260. In an erase operation, the page buffers PB may float the bit lines BL.

The control logic 230 may output a row address RADD of an address ADD received through the input/output buffer 260, to the row decoder 210, and output a column address CADD of the address ADD to the column decoder 250. The control logic 230 may control the page buffer circuit 220 and the voltage generator 240 to access selected memory cells, in response to a command CMD received through the input/output buffer 260.

The voltage generator 240 may generate various voltages required in the semiconductor memory device. For example, the voltage generator 240 may generate a program voltage, a pass voltage, a select read voltage and an unselect read voltage.

The column decoder 250 may input program data to the page buffer circuit 220 in response to a column address CADD from the control logic 230.

Figure 2:
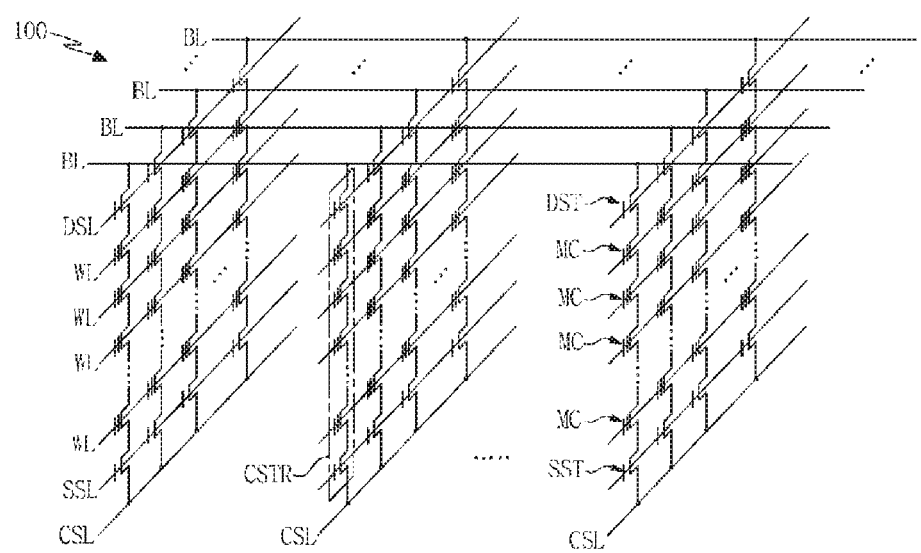
FIG. 2 is an equivalent circuit diagram illustrating a representation of an example of a memory cell array shown in FIG. 1.

FIG. 2 is an equivalent circuit diagram illustrating a representation of an example of the memory cell array shown in FIG. 1.

Referring to FIG. 2, the memory cell array 100 may include a plurality of cell strings CSTR which are coupled between a plurality of bit lines BL and a plurality of common source lines CSL.

Each of the cell strings CSTR may include a drain select transistor DST, a plurality of memory cells MC and a source select transistor SST which are coupled in series between a corresponding bit line BL and a corresponding common source line CSL.

Source select lines SSL, a plurality of word lines WL and drain select lines DSL may be provided between the common source lines CSL and the bit lines BL. The gate of the source select transistor SST may be coupled to a source select line SSL. The gates of the memory cells MC may be coupled to corresponding word lines WL, respectively. The gate of the drain select transistor DST may be coupled to a drain select line DSL.

The source of the source select transistor SST may be coupled to a corresponding common source line CSL. The drain of the source select transistor SST may be coupled to the source of the lowermost memory cell MC. The source of the drain select transistor DST may be coupled to the drain of the uppermost memory cell MC. The drain of the drain select transistor DST may be coupled to a corresponding bit line BL.

While FIG. 2 illustrates a structure in which each cell string CSTR includes one drain select transistor DST and one source select transistor SST, it is to be noted that the embodiment is not limited thereto and each cell string CSTR may include a plurality of drain select transistors DST or/and a plurality of source select transistors SST.

If a signal is applied to the gate of the drain select transistor DST through the drain select line DSL, a signal applied through the bit line BL is transferred to the memory cells MC which are coupled in series, by which a data read or write operation may be performed. If a signal is applied to the gate of the source select transistor SST through the source select line SSL, an erase operation of erasing all the data stored in the memory cells MC may be performed.

Hereinbelow, in the accompanying drawings, a direction perpendicular to the top surface of a substrate is defined as a first direction FD, and two directions parallel to the top surface of the substrate and intersecting with each other are defined as a second direction SD and a third direction TD, respectively. The substrate may correspond to a first substrate (the reference numeral 310 of FIG. 4) or a second substrate (the reference numeral 410 of FIG. 4) which will be described below. The second direction SD may correspond to the extending direction of word lines, and the third direction TD may correspond to the extending direction of bit lines. The second direction SD and the third direction TD may intersect substantially perpendicularly with each other. In the drawings, a direction indicated by an arrow and a direction opposite thereto represent the same direction.

Figure 3:
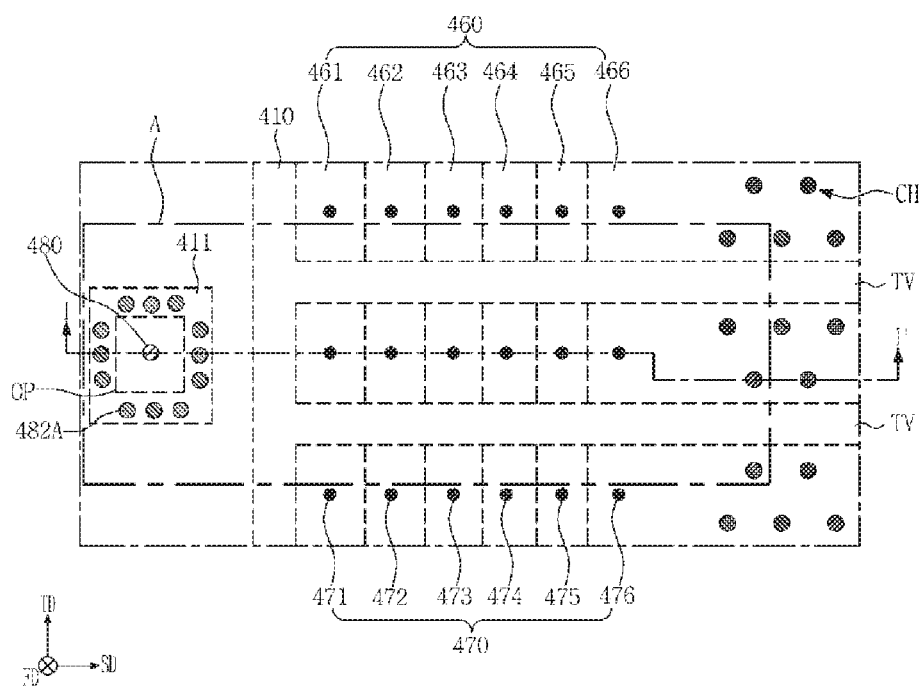
FIG. 3 is a top view illustrating a representation of an example of a semiconductor memory device in accordance with an embodiment of the present invention.

FIG. 3 is a top view illustrating a representation of an example of a semiconductor memory device in accordance with an embodiment of the present invention.

Referring to FIG. 3, the semiconductor memory device in accordance with the embodiment may include a plurality of channel structures CH, first contacts 471 to 476, collectively indicated with numeral 470, which are coupled to a plurality of gate electrode layers 461 to 466, collectively indicated by numeral 460, respectively, stacked to be adjacent to the channel structures CH, a second contact 480 which is coupled to a bottom wiring line 340 (see FIG. 4), and a plurality of dummy contacts 482A which are disposed adjacent to the second contact 480.

The channel structures CH, the first contacts 470, the second contact 480 and the dummy contacts 482A may extend in the first direction FD. The gate electrode layers 460 may be stacked on the second substrate 410 along the first direction FD to surround the channel structures CH. The gate electrode layers 460 and the channel structures CH may be divided into a plurality of regions by vertical slits TV. Each of the plurality of regions defined by the vertical slits TV may be provided as a memory block.

The channel structures CH may be disposed in such a way as to be separated from one another in the second direction SD and the third direction TD. The number and disposition of the channel structures CH may be changed variously. For example, the channel structures CH may be disposed in a zigzag style as shown in FIG. 3. The disposition of the channel structures CH of memory blocks which are adjacent to each other with the vertical slits TV interposed therebetween may be symmetrical as shown in FIG. 3, but it is to be noted that the embodiment is not necessarily limited thereto.

Figure 4:
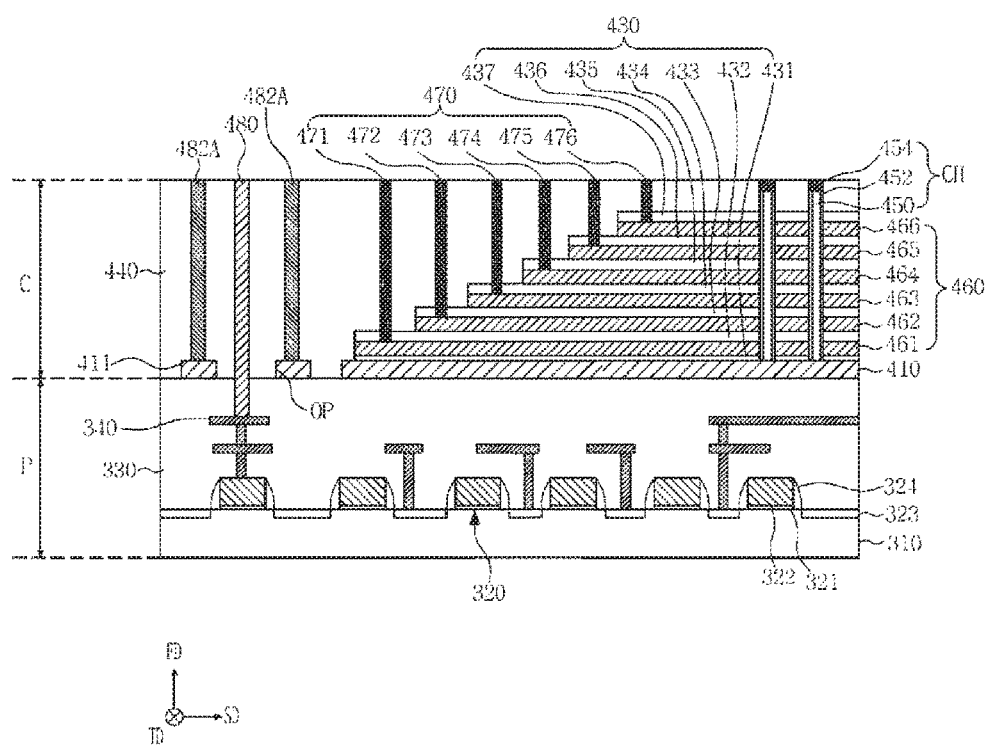
FIG. 4 is a cross-sectional view taken along the line I-I' of FIG. 3.

An etch stopper 411 may be disposed on one side at the same level as the second substrate 410 shown in FIG. 4. The etch stopper 411 may be disposed to be separated by a predetermined gap from the second substrate 410. The etch stopper 411 may have an opening OP. The etch stopper 411 may have a substantially rectangular frame shape when viewed from the top. The opening OP may be disposed in a center portion of the etch stopper 411. The opening OP overlaps with the second contact 480. The second contact 480 may pass through the opening OP of the etch stopper 411 to contact the bottom wiring line 340 shown in FIG. 4.

The dummy contacts 482A may be disposed adjacent to the second contact 480. The dummy contacts 482A may be provided around the second contact 480 in a plural number. The plurality of dummy contacts 482A may be arranged in a generally rectangular frame shape which surrounds the second contact 480. The dummy contacts 482A may overlap with the etch stopper 411 in the first direction FD. The dummy contacts 482A may be arranged along the edges of the opening OP of the etch stopper 411.

Each of the dummy contacts 482A may have the same shape as the second contact 480 when viewed from the top. For example, the second contact 480 and the dummy contacts 482A may have a circular shape as shown in FIG. 3 when viewed from the top. The planar area of each dummy contact 482A may be substantially the same as the planar area of the second contact 480. The dummy contacts 482A may be formed of the same material as the second contact 480. For example, the second contact 480 and the dummy contacts 482A may be made of or include at least one of a metal and a metal silicide.

Figure 5:
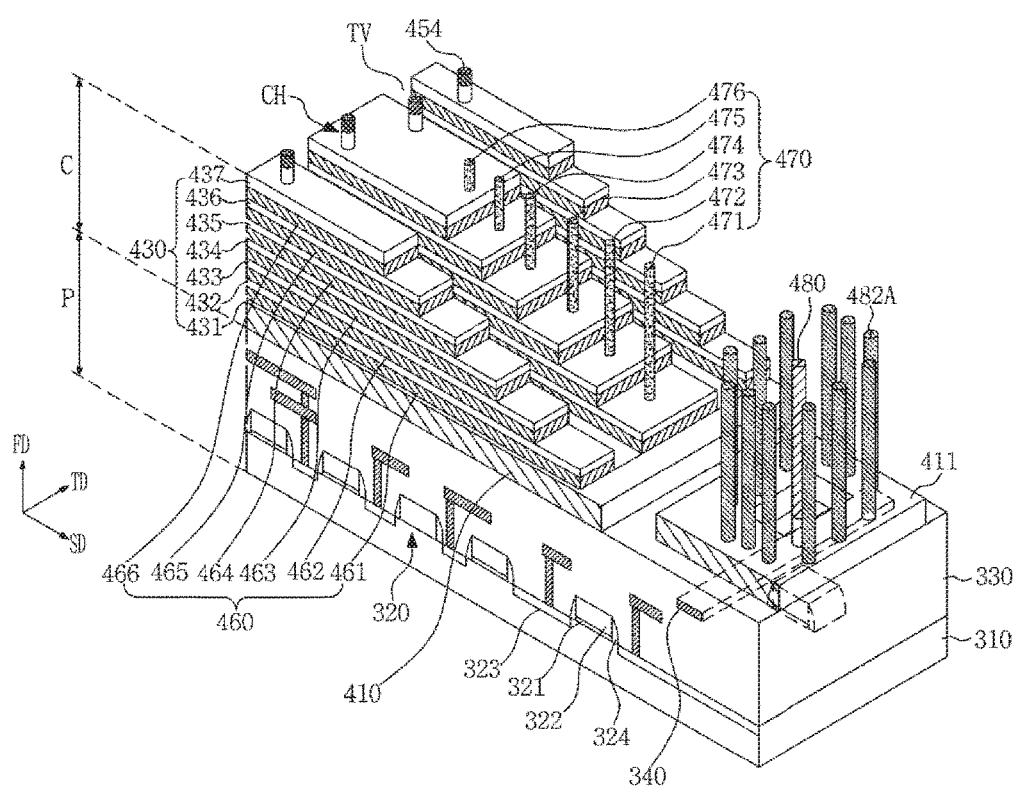
FIG. 5 is a perspective view illustrating the part A of FIG. 3.

Hereunder, the components of the semiconductor memory device in accordance with the embodiment will be described in detail with reference to FIGS. 4 and 5. FIG. 4 is a cross-sectional view taken along the line I-I' of FIG. 3, and FIG. 5 is a perspective view illustrating the part A of FIG. 3. In FIG. 5, in order to easily explain the structures and dispositions of the contacts 470, 480 and 482A, illustration of a second dielectric layer 440 is omitted.

Referring to FIGS. 4 and 5, the semiconductor memory device in accordance with the embodiment may have a PUC (peri under cell) structure. A cell region C including the plurality of gate electrode layers 461 to 466 (460) and the channel structures CH may be defined on the top of a peripheral circuit region P including a plurality of peripheral circuit elements 320.

The peripheral circuit region P may include the first substrate 310, and the cell region C may include the second substrate 410. The first substrate 310 may be constructed by a monocrystalline silicon substrate. The second substrate 410 may be formed of polycrystalline silicon. Since the second substrate 410 should be formed on a first dielectric layer 330 unlike the first substrate 310 which may use a monocrystalline silicon substrate, the second substrate 410 may be formed of polycrystalline silicon.

The peripheral circuit region P may include the first substrate 310, the peripheral circuit elements 320, the first dielectric layer 330 and the bottom wiring line 340. The peripheral circuit elements 320 may include planar transistors. In an embodiment, the peripheral circuit elements 320 are constructed by planar transistors, each of the peripheral circuit elements 320 may include a gate dielectric layer 321, a gate electrode 322, source/drain regions 323 and gate spacers 324. The peripheral circuit elements 320 may construct the peripheral circuit 200 of FIG. 1.

The first dielectric layer 330 may be formed on the first substrate 310 to cover the peripheral circuit elements 320. The first dielectric layer 330 may be or include a dielectric material, for example, a silicon oxide.

The bottom wiring line 340 may be disposed in the first dielectric layer 330, and may be electrically coupled to at least one of the peripheral circuit elements 320.

The cell region C may be disposed on the peripheral circuit region P. The second substrate 410 included in the cell region C may be disposed on the top surface of the first dielectric layer 330 of the peripheral circuit region P.

The channel structures CH may be disposed on the top surface of the second substrate 410. The channel structures CH may extend from the top surface of the second substrate 410 in the first direction FD. The gate electrode layers 461 to 466 (460) may be stacked on the top surface of the second substrate 410 to surround the channel structures CH.

The gate electrode layers 460 may correspond to the row lines RL described above with reference to FIG. 1. At least one layer from the lowermost among the gate electrode layers 460 may be used as a source select line. At least one layer from the uppermost among the gate electrode layers 460 may be used as a drain select line. The gate electrode layers 460 between the source select line and the drain select line may be used as word lines. Source select transistors may be formed where the source select line surrounds the channel structures CH, memory cells may be formed where the word lines surround the channel structures CH, and drain select transistors may be formed where the drain select line surrounds the channel structures CH. By the above structure, cell strings including source select transistors, memory cells and drain select transistors which are disposed along the channel structures CH may be constructed.

The gate electrode layers 460 may extend by different lengths along the second direction SD to form a step structure in a partial region on the second substrate 410. Interlayer dielectric layers 431 to 437, collectively indicated with numeral 430 may be disposed on and under the gate electrode layers 460. The gate electrode layers 460 and the Interlayer dielectric layers 430 may be alternatively stacked on the top surface of the second substrate 410 to surround the channel structures CH. The interlayer dielectric layers 430 may include silicon oxide layers. The interlayer dielectric layers 431 to 437 may also extend by different lengths along the second direction SD to in conformity to the step structure of the gate electrode layers 460. Each of the channel structures CH may include a channel layer 450 and a gate dielectric layer 452 which is disposed between the channel layer 450 and the gate electrode layers 460 and the interlayer dielectric layers 430. The channel layer 450 may be made of or include polysilicon or monocrystalline silicon, and may include a P-type impurity. The channel layer 450 may include boron (B) in some regions. The channel layer 450 may have the shape of a pillar or a solid cylinder which is completely filled up to its center. In a modified embodiment, (not shown), the channel layer 450 may have the shape of a tube in which a center region is open. In this case, a buried dielectric layer may be formed in the open center region of the channel layer 450.

The gate dielectric layer 452 may have the shape of a straw or a cylindrical shell which surrounds the outer wall of the channel layer 450. While not shown, the gate dielectric layer 452 may include a tunnel dielectric layer, a charge storage layer and a blocking layer which are sequentially stacked from the outer wall of the channel layer 450. The tunnel dielectric layer may be made of or include a silicon oxide, a hafnium oxide, an aluminum oxide, a zirconium oxide or a tantalum oxide. The charge storage layer may be made of or include a silicon nitride, a boron nitride, a silicon boron nitride or polysilicon doped with an impurity. The blocking layer may be made of or include a single layer or a stack layer of a silicon oxide, a silicon nitride, a hafnium oxide, an aluminum oxide, a zirconium oxide and a tantalum oxide. In some embodiments, the gate dielectric layer 452 may have an ONO (oxide-nitride-oxide) stack structure in which an oxide layer, a nitride layer and an oxide layer are sequentially stacked.

Each of the channel structures CH may further include a drain region 454 which is disposed on the tops of the channel layer 450 and the gate dielectric layer 452. The drain region 454 may be made of or include doped polysilicon.

The second dielectric layer 440 which covers the side surfaces and top surfaces of the second substrate 410, the gate electrode layers 460 and the interlayer dielectric layers 430 and covers the side surfaces of the channel structures CH may be formed on the first dielectric layer 330. The second dielectric layer 440 may be formed of the same material as the first dielectric layer 330.

The plurality of first contacts 471 to 476 (470) extend through the second dielectric layer 440 in the first direction FD and are coupled to the gate electrode layers 461 to 466 (460), respectively. The plurality of first contacts 471 to 476 (470) may be formed on the step structure of the gate electrode layers 460.

The second contact 480 is formed on one side of the gate electrode layers 460 and the second substrate 410, extends through the second dielectric layer 440 and the first dielectric layer 330 in the first direction FD, and is coupled to the bottom wiring line 340. The second contact 480 is electrically coupled to at least one of the plurality of peripheral circuit elements 320 through the bottom wiring line 340.

The second contact 480 electrically couples a top wiring line (not shown) formed on the second dielectric layer 440 with the bottom wiring line 340. The second contact 480 is disposed to stand alone because the required number thereof is small and the frequency of use thereof is low.

In order to form the second contact 480, a hard mask pattern which opens a portion where the second contact 480 is to be formed may be formed on the second dielectric layer 440, a hole which exposes the bottom wiring line 340 may be formed by etching the second dielectric layer 440 opened by the hard mask pattern and the first dielectric layer 330, and a conductive material may be filled in the hole.

Due to increase in the degree of integration, the stack number of the gate electrode layers 460 is increased, and the thickness of the second dielectric layer 440 increases. Carbon from hydrofluorocarbon which is an etching compound produced during a hole etching process accumulates in the hole during etching and is polymerized to form a polymer. The accumulation of the polymer occurs adjacent to the sidewall of the hard mask pattern as the upper sidewall of the hole. As the thickness of the second dielectric layer 440 increases and thus an amount of the second dielectric layer 440 to be etched in the hole etching process increases, an amount of the polymer produced during the hole etching process increases as well.

The polymer is produced less in a portion where a hole pattern density is high, but is produced much in an embodiment a hole pattern density is low and a distance from an adjacent hole is large. Since the second contact 480 is disposed in such a way as to stand alone, a thick polymer layer may accumulate on the upper sidewall of the hole during the etching process for forming the hole, and the entrance of the hole may be clogged by the polymer layer, whereby the flow of an etchant into the hole may be blocked. In this case, the bottom portion of the hole may not be opened. As a consequence, since the second contact 480 is not electrically coupled to the bottom wiring line 340, the normal operation of the semiconductor memory device may be impossible, and thus, the reliability of the semiconductor memory device may degrade.

In the present embodiment, the dummy contacts 482A are additionally disposed around the second contact 480. The dummy contacts 482A may pass through the second dielectric layer 440 in the first direction FD.

The dummy contacts 482A are formed together with the second contact 480 when forming the second contact 480. For example, by additionally forming holes for dummy contacts at positions adjacent to a hole for a second contact in the hole etching process for forming the second contact 480 and filling a conductive material in the holes for dummy contacts in a process of filling a conductive material in the hole for a second contact, the second contact 480 and the dummy contacts 482A may be formed together.

Because the pattern density of a region for forming the hole for a second contact is increased due to the presence of the holes for dummy contacts, excessive production of a polymer due to a low pattern density when etching the hole is suppressed, whereby it is possible to prevent the hole for the second contact from being clogged by the polymer. Therefore, since it is possible to cause an etchant to smoothly flow into the hole for the second contact, blocking of the opening of the hole for a second contact may be prevented. Hence, it is possible to prevent the occurrence of a failure in which the second contact 480 is not electrically coupled to the bottom wiring line 340 due to blocking of the opening of the hole for the second contact.

The etch stopper 411 may be disposed under the dummy contacts 482A. The etch stopper 411 may be coupled to the bottom ends of the dummy contacts 482A. The etch stopper 411 may be disposed on the top surface of the first dielectric layer 330. The etch stopper 411 may be disposed on the top surface of the first dielectric layer 330 to be planar with the second substrate 410.

The etch stopper 411 may be made or include a material which has a predetermined etching selectivity different from the second dielectric layer 440. In an embodiment, in an embodiment the second dielectric layer 440 is a silicon oxide layer, the etch stopper 411 may be constructed by at least one of a silicon nitride layer and a polycrystalline silicon layer. The etch stopper 411 may be formed at the same processing step as the second substrate 410. In this case, the etch stopper 411 may be formed of the same material as the second substrate 410, for example, a polycrystalline silicon layer.

In the process for forming the holes for the dummy contacts, as etching is stopped by the etch stopper 411, the holes for the dummy contacts do not extend to the bottom wiring line 340 and the peripheral circuit elements 320 of the peripheral circuit region P. Hence, the etch stopper 411 prevents a short circuit from occurring by preventing the dummy contacts 482A to be coupled with the bottom wiring line 340 and the peripheral circuit elements 320.

The etch stopper 411 may have the opening OP through which the second contact 480 passes. The opening OP may be disposed to overlap with a portion of the bottom wiring line 340 in the first direction FD. The second contact 480 may be coupled to the bottom wiring line 340 by passing through the opening OP of the etch stopper 411.

The dummy contacts 482A may be coupled to the etch stopper 411 through the second dielectric layer 440 in the first direction FD. Each of the dummy contacts 482A may have substantially the same structure as the second contact 480 when viewed from the top. For example, the second contact 480 and the dummy contacts 482A may have a circular structure when viewed from the top. Each of the dummy contacts 482A may have substantially the same size as the second contact 480 when viewed from the top.

In an embodiment, the plurality of dummy contacts 482A may be provided around the second contact 480. The plurality of dummy contacts 482A may be arranged in a shape which surrounds the second contact 480 when viewed on the top. In an embodiment, the plurality of dummy contacts 482A may be arranged along the edges of the opening OP of the etch stopper 411.

According to the present embodiment, by additionally forming the holes for dummy contacts at the positions adjacent to the hole for the second contact during the etching process for forming the hole for the second contact, it is possible to suppress a polymer from being produced on the sidewall of the hole for the second contact, during the etching process for forming the hole for the second contact. Therefore, the present invention prevents the hole for the second contact from being clogged by the polymer and allows the n etchant to flow smoothly into the hole for the second contact. Hence failure to obtain a fully opened hole for the second contact is prevented. Thus, since it is possible to prevent a coupling failure between the second contact 480 and the bottom wiring line 340 due to blocking of the opening of the hole for the second contact, the reliability of the semiconductor memory device may be improved substantially In embodiments to be described below with reference to FIGS. 6 to 8, the same technical terms and the same reference numerals will be used to refer to substantially the same components as the components of the embodiment described above with reference to FIGS. 3 to 5, and therefore repeated detailed descriptions for the same components will be omitted.

Figure 6:
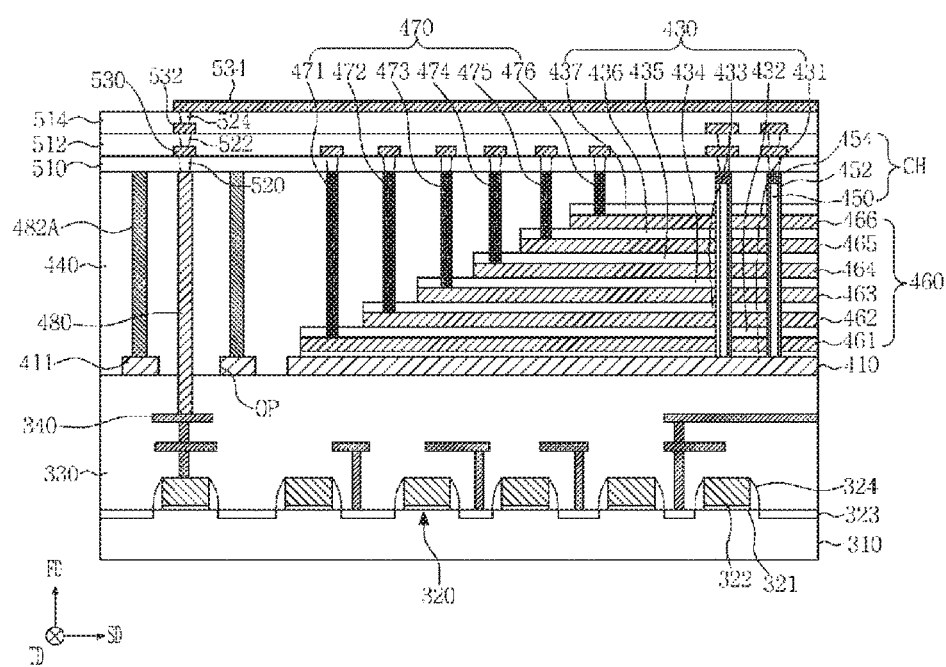
FIG. 6 is a cross-sectional view illustrating a representation of an example of a semiconductor memory device in accordance with an embodiment of the present invention.

FIG. 6 is a cross-sectional view illustrating a representation of an example of a semiconductor memory device in accordance with an embodiment of the present invention.

Referring to FIG. 6, a third dielectric layer 510 which covers the top surfaces of the first contacts 470, the second contact 480, the dummy contacts 482A and the channel structures CH may be formed on the second dielectric layer 440. The third dielectric layer 510 may be made of or include a dielectric material such as, for example, a silicon oxide.

A third contact 520 which is coupled to the second contact 480 may be formed through the third dielectric layer 510. No contacts are formed on the dummy contacts 482A. A first top wiring line 530 which is coupled to the third contact 520 may be formed on the third dielectric layer 510. A fourth dielectric layer 512 which covers the side surfaces and top surface of the first top wiring line 530 may be formed on the third dielectric layer 510. The fourth dielectric layer 512 may be made of or include a dielectric material such as, for example, a silicon oxide.

A fourth contact 522 which is coupled to the first top wiring line 530 may be formed through the fourth dielectric layer 512. A second top wiring line 532 which is coupled to the fourth contact 522 may be formed on the fourth dielectric layer 512. A fifth dielectric layer 514 which covers the side surfaces and top surface of the second top wiring line 532 may be formed on the fourth dielectric layer 512. The fifth dielectric layer 514 may be made of or include a dielectric material such as, for example, a silicon oxide. A fifth contact 524 which is coupled to the second top wiring line 532 may be formed through the fifth dielectric layer 514. A third top wiring line 534 which is coupled to the fifth contact 524 may be formed on the fifth dielectric layer 514. The third top wiring line 534 may be electrically coupled to peripheral circuit elements 320 through the fifth contact 524, the second top wiring line 532, the fourth contact 522, the first top wiring line 530, the third contact 520, the second contact 480 and the bottom wiring line 340.

Figure 7:
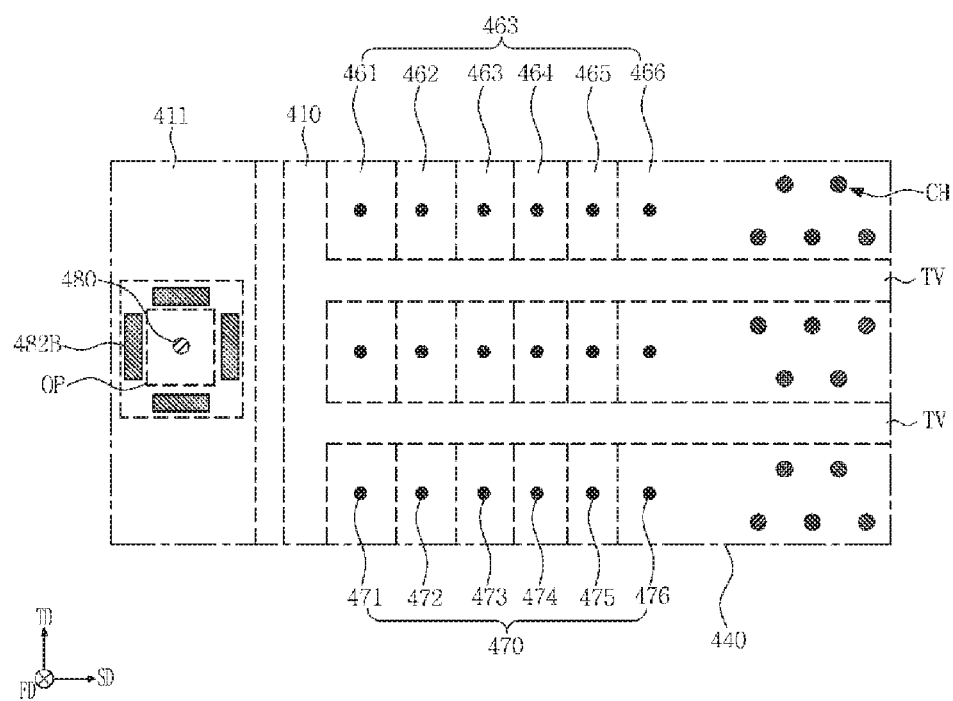
FIGS. 7 and 8 are top views illustrating representations of examples of semiconductor memory devices in accordance with embodiments of the present invention.
Figure 8:
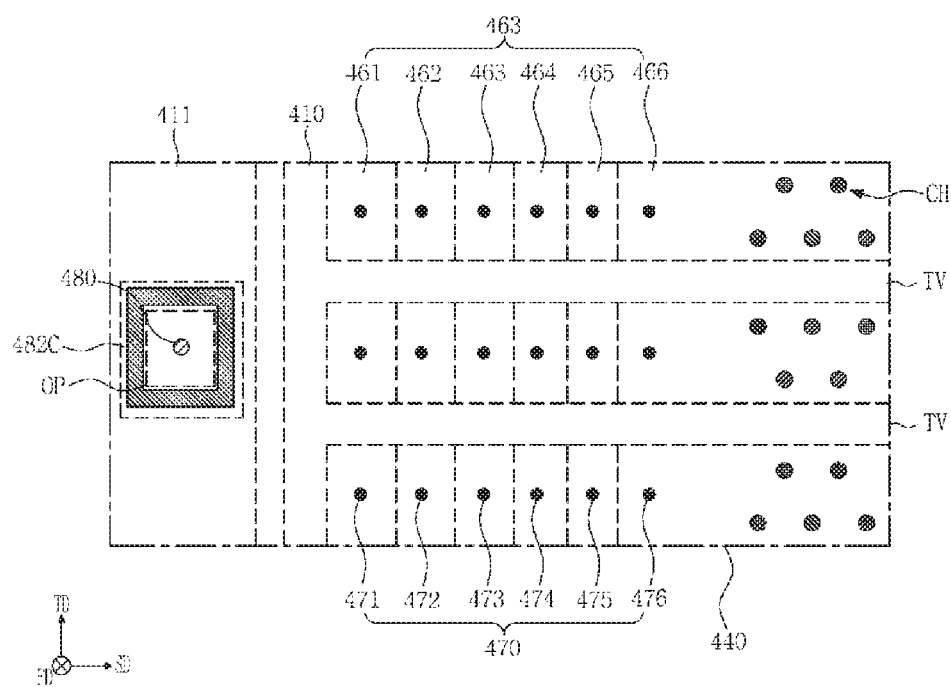

FIGS. 7 and 8 are top views illustrating representations of examples of semiconductor memory devices in accordance with embodiments of the present invention.

Referring to FIG. 7, a plurality of dummy contacts 482B are disposed adjacent to a second contact 480. Each of the dummy contacts 482B may have a different shape from the second contact 480 when viewed from the top. For example, the second contact 480 may have a circular shape when viewed from the top, and each of the dummy contacts 482B may have a bar shape. The plurality of dummy contacts 482B may be arranged to form in a rectangular frame shape which surrounds the second contact 480 when viewed on the top. In the illustrated embodiment of FIG. 7, four bar shape dummy contacts are provided, each one forming one side of the rectangular frame with the dummy contacts not contacting one another.

Referring to FIG. 8, a dummy contact 482C may be disposed around a second contact 480. The dummy contact 482C may have a shape which surrounds the second contact 480, when viewed from the top. Hence, in the embodiment of FIG. 8, one dummy contact in the form of a continuous rectangular frame 482C surrounds the second contact.

In another embodiments, not shown the dummy contact may have a continuous frame shape in circular, oval or polygonal etc. In another embodiments, not shown the dummy contact may be arranged in a non-continuous frame shape when viewed from the top.

FIGS. 9A to 17B are representations of examples of views to assist in the explanation of a method for manufacturing a semiconductor memory device in accordance with an embodiment of the present invention. FIGS. 9B to 17B are cross-sectional views taken along the lines II-II' of FIGS. 9A to 17A.

Figure 9A:
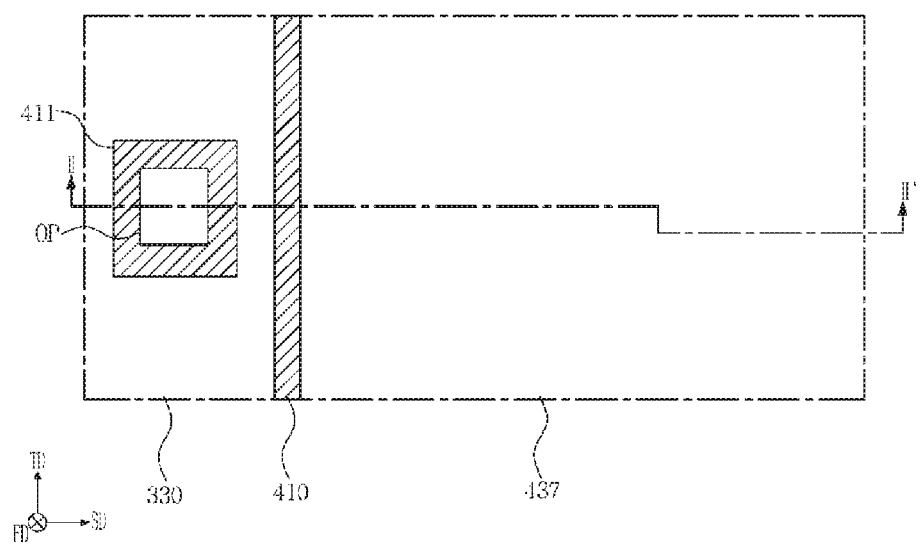
FIGS. 9A to 17B are representations of examples of views to assist in the explanation of a method for manufacturing a semiconductor memory device in accordance with an embodiment of the present invention.
Figure 9B:
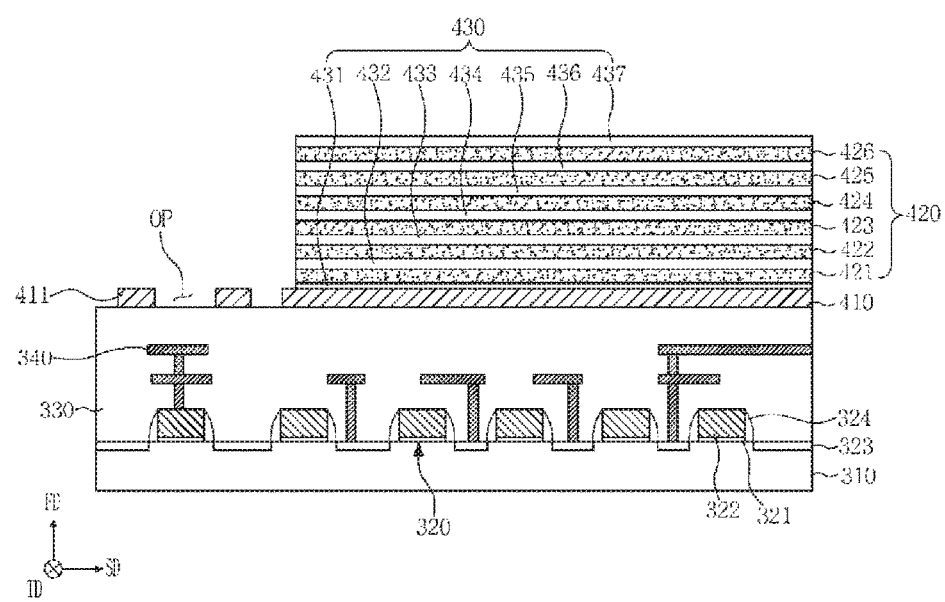

Referring to FIGS. 9A and 9B, peripheral circuit elements 320 and a first dielectric layer 330 may be formed on a first substrate 310. The first substrate 310 may be a monocrystalline silicon substrate. The peripheral circuit elements 320 may be or include planar transistors. In an embodiment, the peripheral circuit elements 320 are planar transistors, each including a gate dielectric layer 321, a gate electrode 322, source/drain regions 323 and gate spacers 324.

The peripheral circuit elements 320 may then be covered by the first dielectric layer 330. The first dielectric layer 330 may be made of or include a dielectric material, for example, a silicon oxide.

A bottom wiring line 340 may be defined in the first dielectric layer 330. The bottom wiring line 340 may be electrically coupled to the peripheral circuit elements 320. The bottom wiring line may be formed in a single or multiple layers.

A second substrate 410 may be formed on the top surface of the first dielectric layer 330. The second substrate 410 may be formed of polycrystalline silicon. The second substrate 410 may be formed by a method of forming polycrystalline silicon at a predetermined region on the first dielectric layer 330 and then growing polycrystalline silicon by using the polycrystalline silicon as a seed layer.

An etch stopper 411 may be formed on the top surface of the first dielectric layer 330. The etch stopper 411 may be disposed on the top surface of the first dielectric layer 330 to be planar with the second substrate 410. The etch stopper 411 may be made of or include a material which has a predetermined etching selectivity different from a second dielectric layer 440 which is formed in a process to be described later with reference to FIGS. 11A and 11B. In an embodiment, the second dielectric layer 440 is a silicon oxide layer, and the etch stopper 411 may be made of or include at least one of a silicon nitride layer and a polycrystalline silicon layer.

In an embodiment, the etch stopper 411 may be formed at the same processing step as the second substrate 410. In this case, the etch stopper 411 may be formed of the same material as the second substrate 410. The etch stopper 411 may have an opening OP that overlaps with a portion of the bottom wiring line 340 in the first direction FD.

A plurality of sacrificial layers 421 to 426, collectively indicated by numeral 420, and a plurality of interlayer dielectric layers 431 to 437, collectively indicated by numeral 430, may be alternately stacked on the second substrate 410. The sacrificial layers 420 may be formed of a material which has a high etching selectivity different from the interlayer dielectric layers 430 and thus are able to be selectively etched. For example, the interlayer dielectric layers 430 may be silicon oxide layers, and the sacrificial layers 420 may be silicon nitride layers.

Figure 10A:
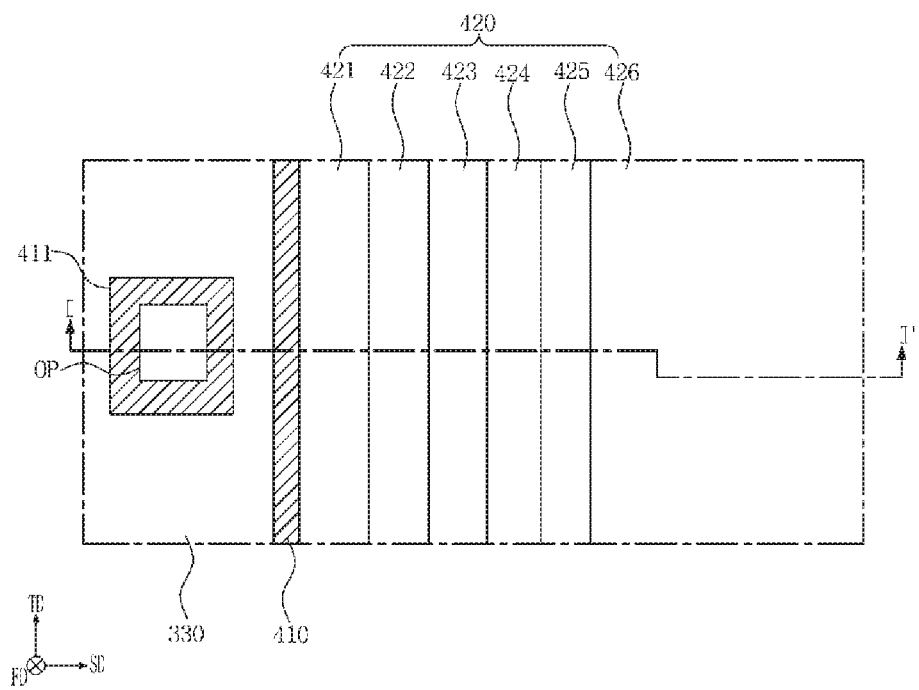
Figure 10B:
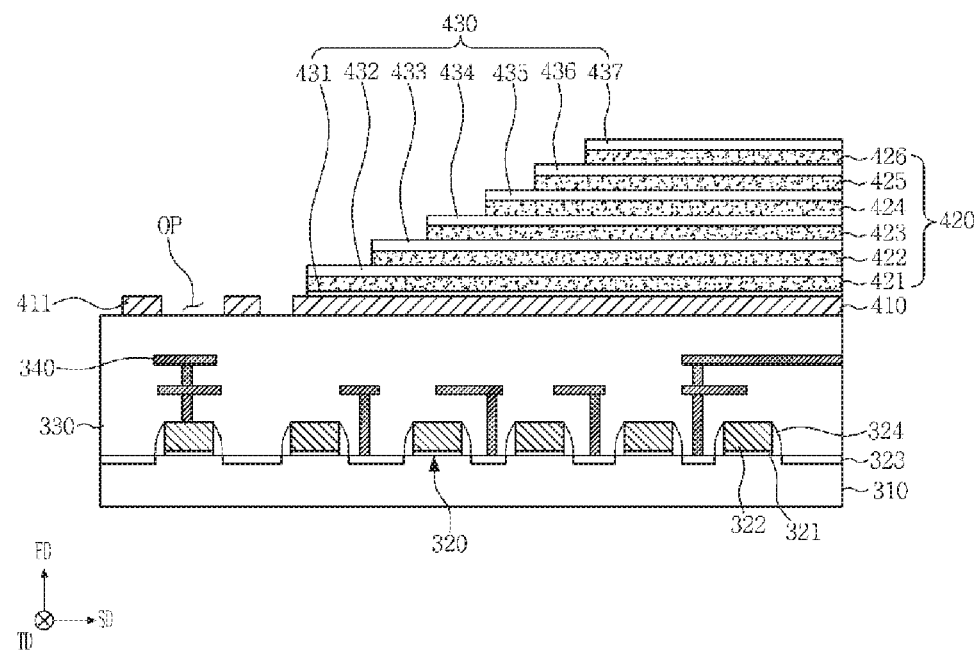

Referring to FIGS. 10A and 10B, by etching the sacrificial layers 420 and the interlayer dielectric layers 430, a step structure having step portions may be formed. In order to form the step portions, a mask layer (not shown) may be formed on the uppermost interlayer dielectric layer 437, and the interlayer dielectric layers 430 and the sacrificial layers 420 which are exposed by the mask layer may be etched. By performing, a plurality of times, the process of etching the interlayer dielectric layers 430 and the sacrificial layers 420 exposed by the mask layer while trimming the mask layer, the interlayer dielectric layers 430 and the sacrificial layers 420 may be sequentially etched, by which the step structure having step portions may be formed.

Figure 11A:
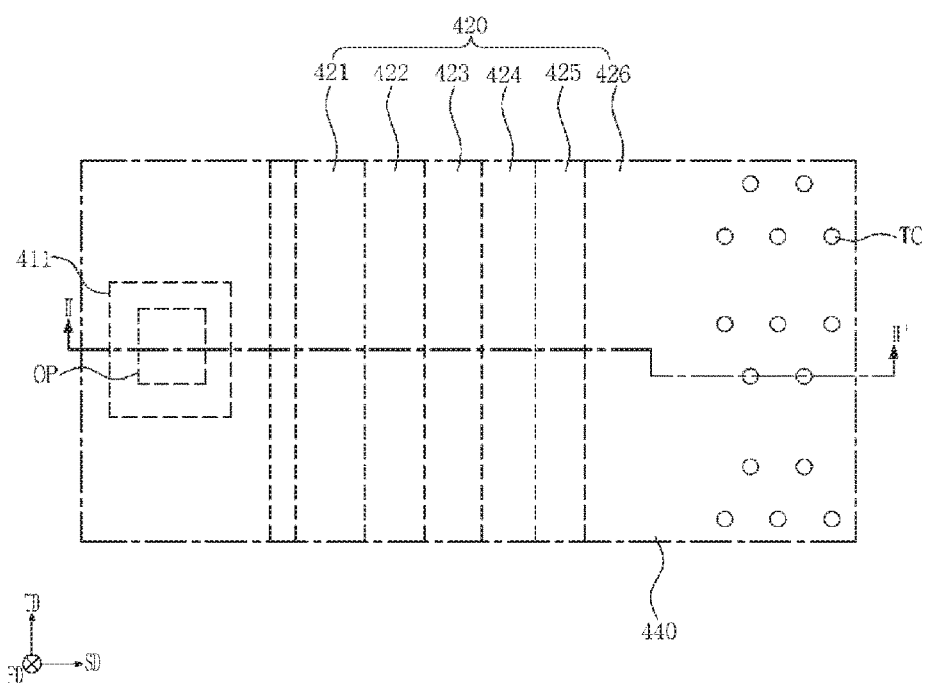
Figure 11B:
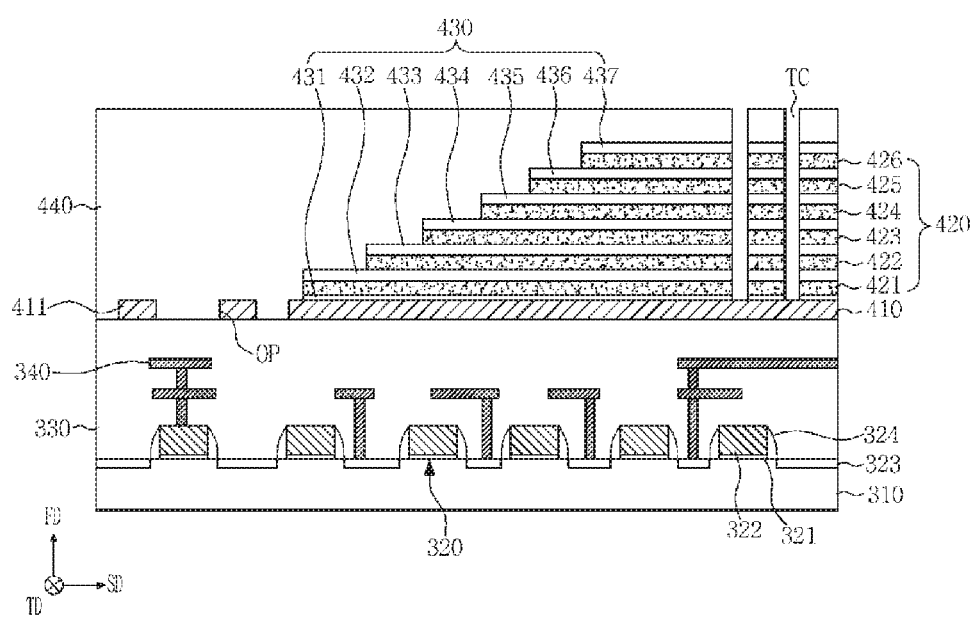

Referring to FIGS. 11A and 11B, the second dielectric layer 440 may be formed on the first dielectric layer 330 and may cover the exposed side surfaces and top surfaces of the second substrate 410, the etch stopper 411, the exposed side and top surfaces of the sacrificial layers 420 and of the interlayer dielectric layers 430. The second dielectric layer 440 may be made or include a silicon oxide layer. The opening OP of the etch stopper 411 may be filled with the second dielectric layer 440.

In order to form channel structures, a plurality of channel holes TC are formed which pass through the second dielectric layer 440, the interlayer dielectric layers 430 and the sacrificial layers 420 to expose the second substrate 410. The hole TC may be formed by forming a photoresist pattern (not shown) on the insulating film 440, etching the insulating film 440, the sacrificial layers 420 and the interlayer insulating films 430 using the photoresist pattern as a mask, and removing the photoresist pattern.

Figure 12A:
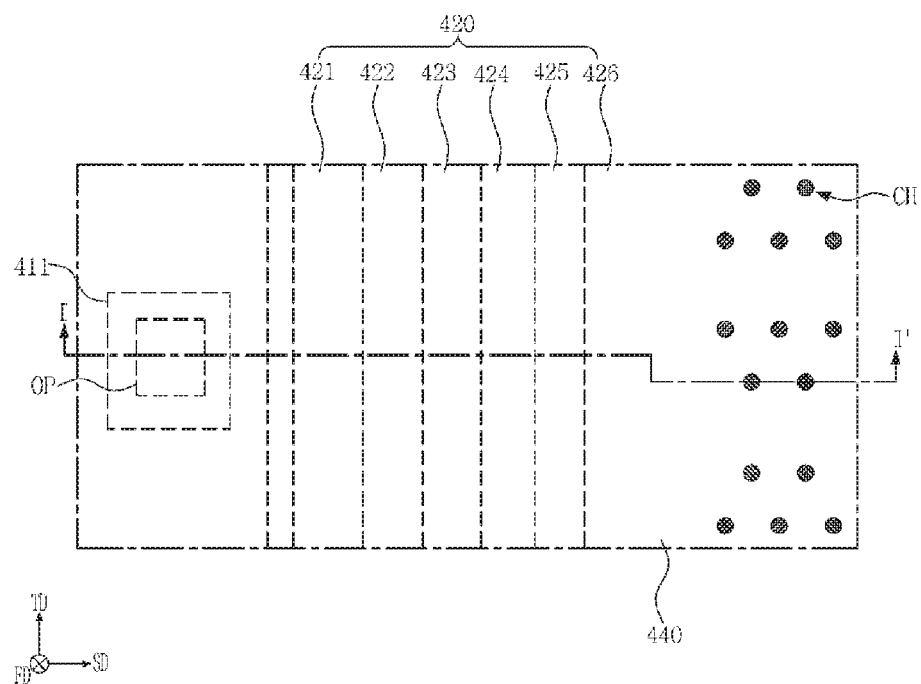
Figure 12B:
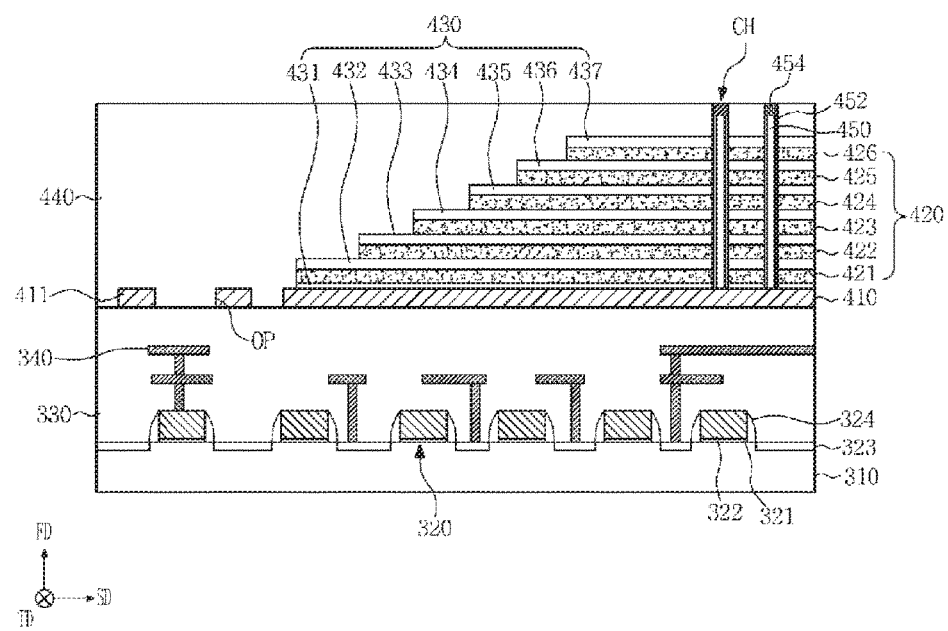

Referring to FIGS. 12A and 12B, by forming a channel layer 450, a gate dielectric layer 452 and a drain region 454 in each of the channel holes TC, channel structures CH may be formed.

The channel layer 450 may have the shape of a pillar or a solid cylinder which is completely filled up to its center. While not shown, the channel layer 450 may have the shape of a tube in which a center region is open. In this case, a buried dielectric layer may be formed in the open center region of the channel layer 450.

Before forming the channel layer 450, the gate dielectric layer 452 may be formed on a side wall of the channel holes TC through, for example, an atomic layer deposition (ALD) or chemical vapor deposition (CVD) process. While not shown, the gate dielectric layer 452 may include a blocking layer, a charge storage layer and a tunnel dielectric layer which are sequentially stacked from a region adjacent to the sacrificial layers 420 and the interlayer dielectric layers 430. The tunnel dielectric layer may be made of or include a silicon oxide, a hafnium oxide, an aluminum oxide, a zirconium oxide or a tantalum oxide. The charge storage layer may be made of or include a silicon nitride, a boron nitride, a silicon boron nitride or polysilicon doped with an impurity. The blocking layer may be made of or include a single layer or a stack layer of a silicon oxide, a silicon nitride, a hafnium oxide, an aluminum oxide, a zirconium oxide and a tantalum oxide. The channel layer 450 may be formed inward of the tunnel dielectric layer. In some embodiments, the gate dielectric layer 452 may have an ONO (oxide-nitride-oxide) stack structure in which an oxide layer, a nitride layer and an oxide layer are sequentially stacked.

The drain region 454 may be formed on the tops of the channel layer 450 and the gate dielectric layer 452. The drain region 454 may be made of or include a conductive material such as polysilicon.

Figure 13A:
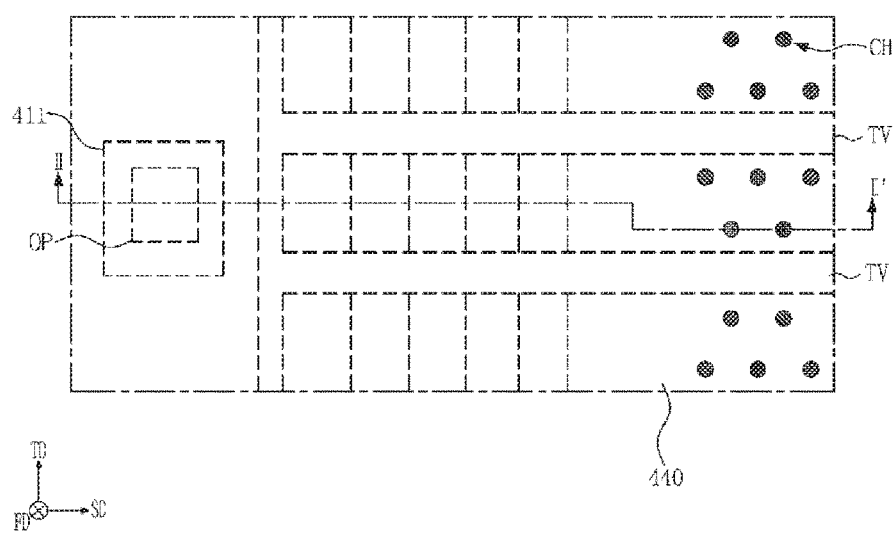
Figure 13B:
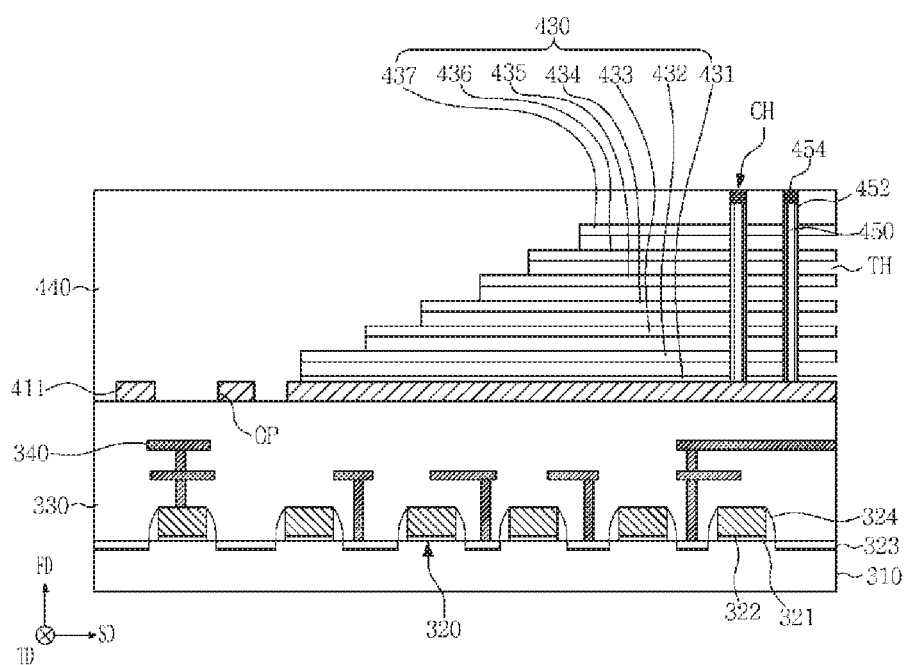

Referring to FIG. 13A, vertical slits TV which extend in the second direction SD are formed to pass through the sacrificial layers 420 and the interlayer dielectric layers 430 to expose the second substrate 410. The vertical slits TV may be spaced apart along the third direction TD. Referring to FIGS. 13A and 13B, the sacrificial layers 420 may then be selectively removed by an etchant which is introduced through the vertical slits TV. By removing the sacrificial layers 420, a plurality of horizontal openings TH may be defined between the interlayer dielectric layers 430. By the horizontal openings TH, portions of the side surfaces of the channel structures CH may be exposed. After being removed the sacrificial layers 420, the interlayer dielectric layers 430 may be supported by the channel structures CH.

Figure 14A:
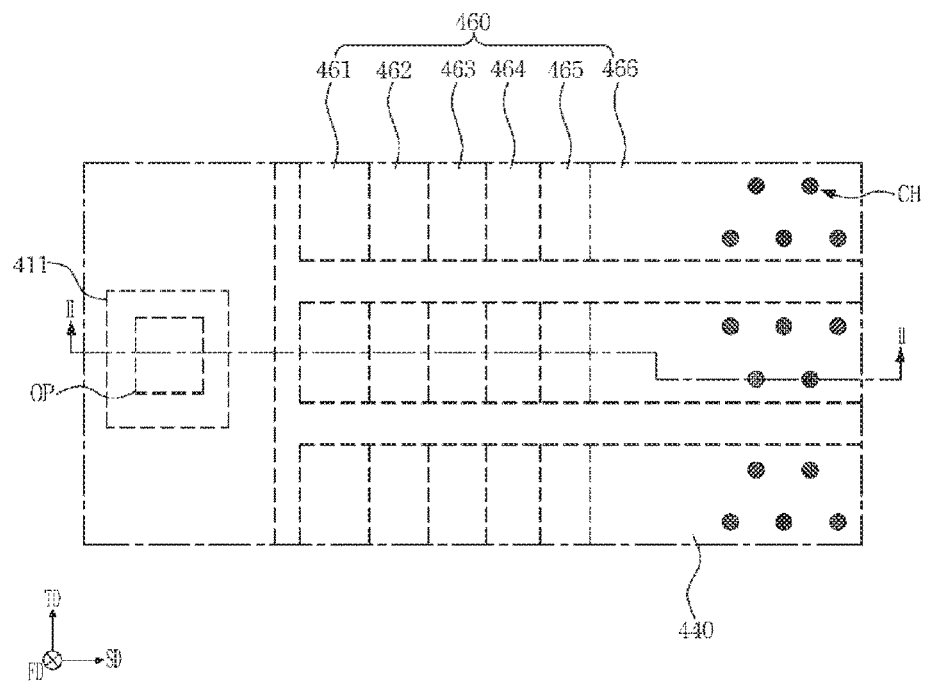
Figure 14B:
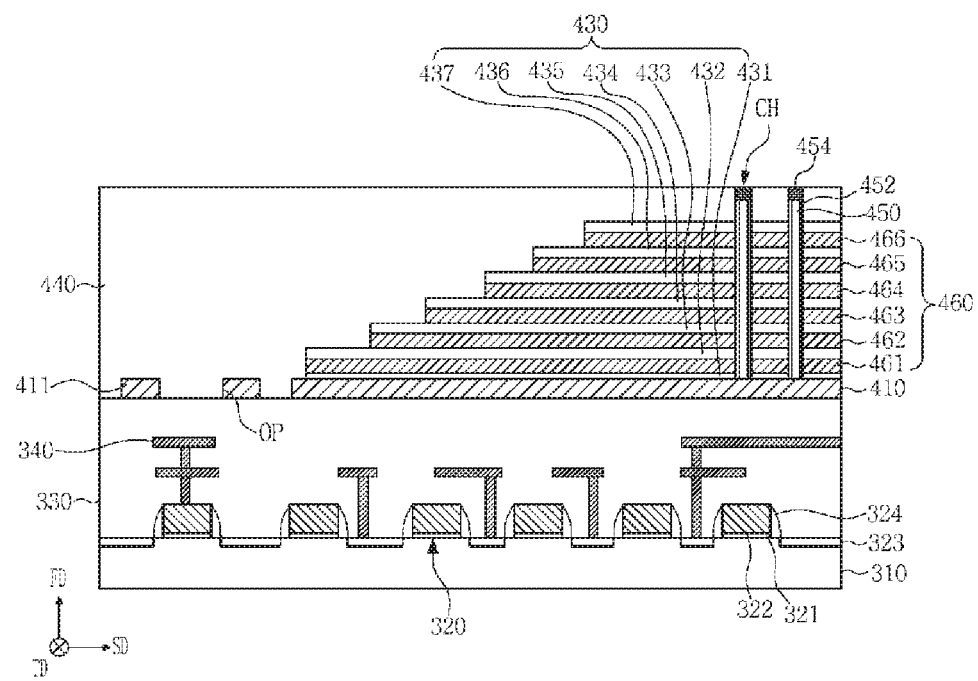

Referring to FIGS. 14A and 14B, a plurality of gate electrode layers 461 to 466, collectively indicated by numeral 460, may be formed in the plurality of horizontal openings TH (see FIG. 13B) which are defined as the sacrificial layers 420 are removed. The gate electrode layers 460 may be made of or include a metal, polycrystalline silicon or a metal silicide material.

Figure 15A:
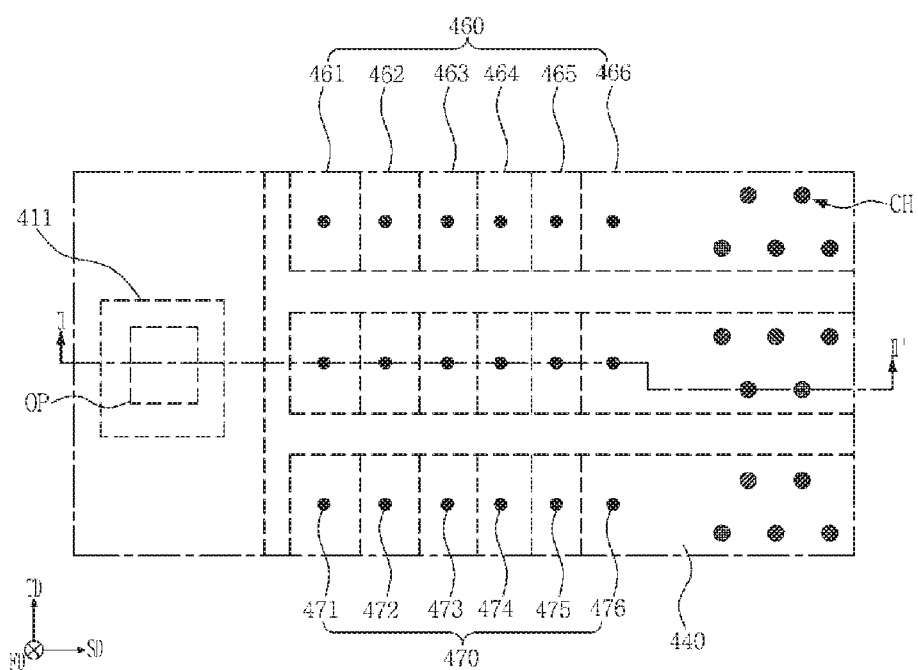
Figure 15B:
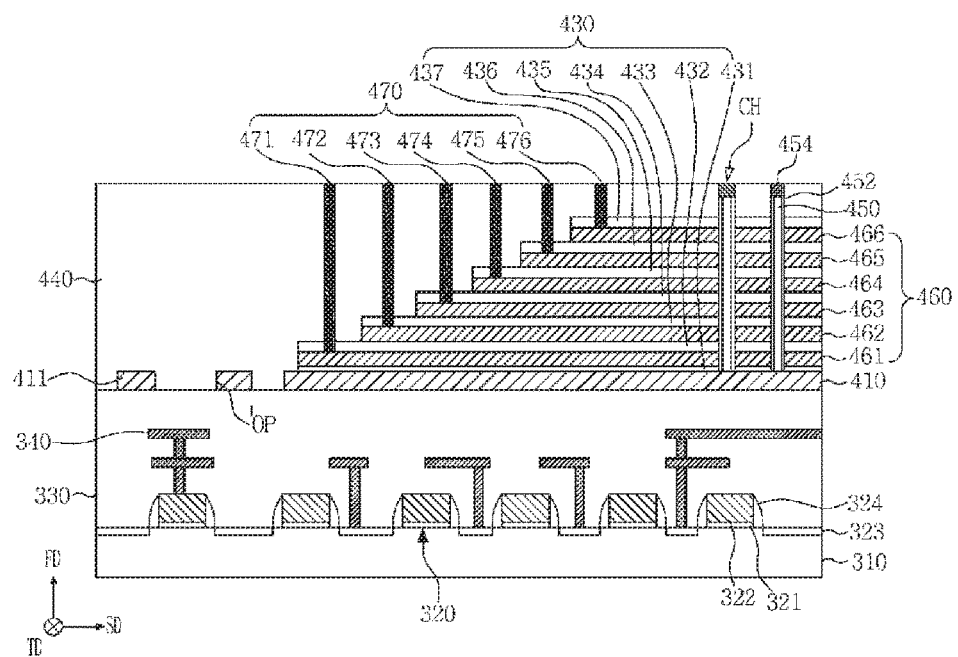

Referring to FIGS. 15A and 15B, first contacts 471 to 476, collectively indicated with numeral 470, are formed. The contacts 471 to 476 may be formed by forming holes which expose the gate electrode layers 460, respectively, through the second dielectric layer 440 and the interlayer dielectric layers 430, in the region defined with the step structure and by filling a conductive material in the holes.

Figure 16A:
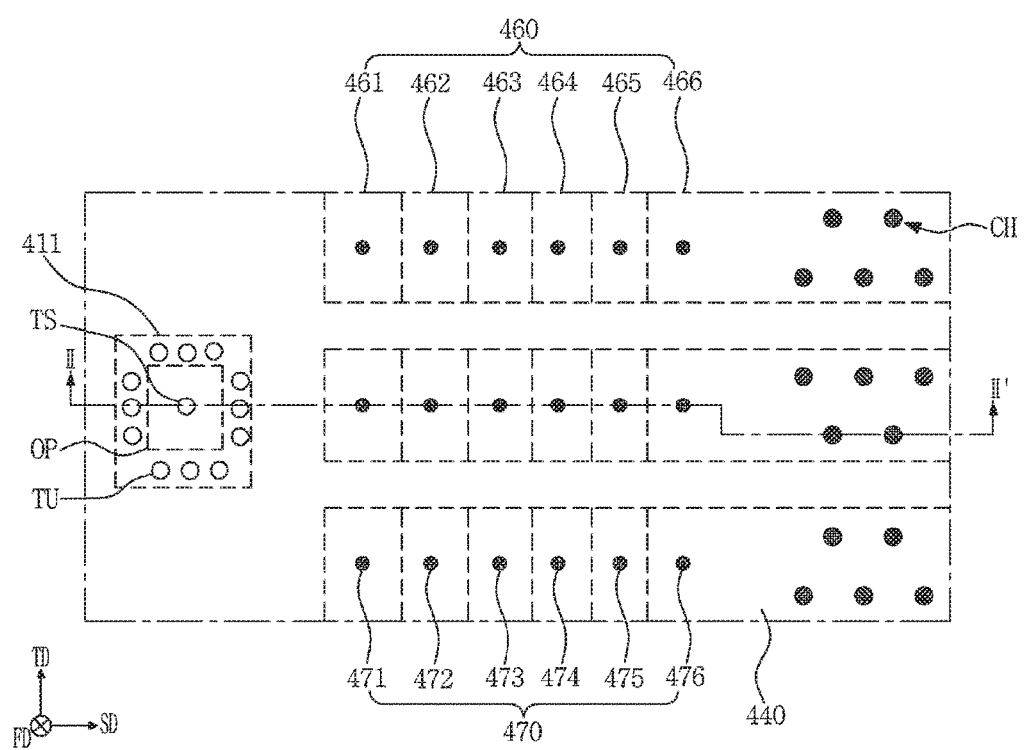
Figure 16B:
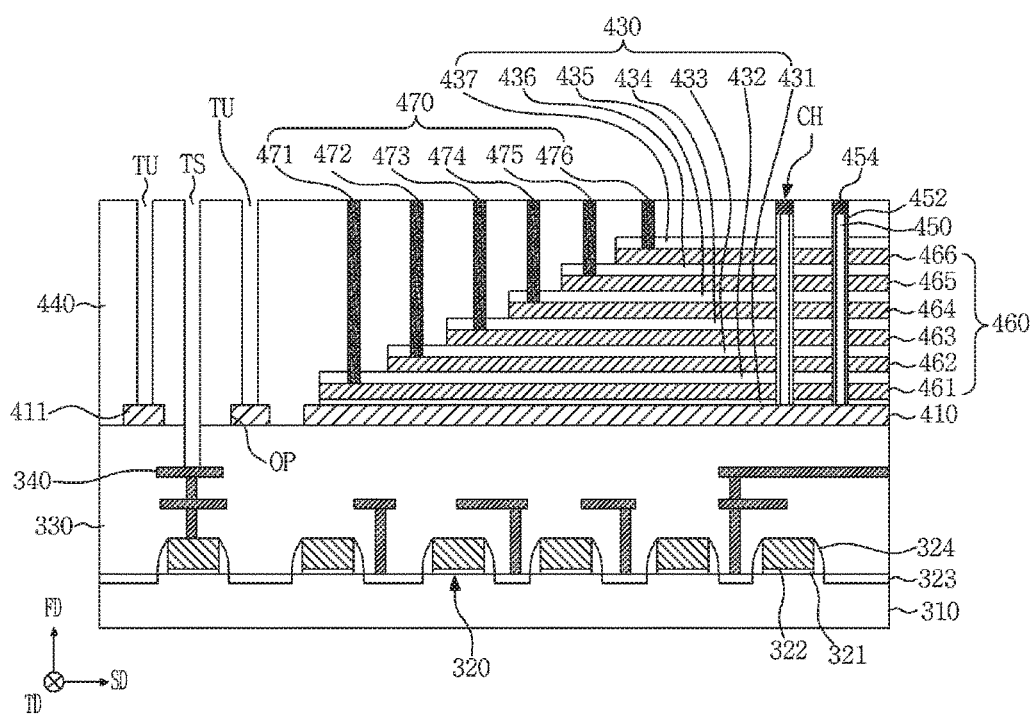

Referring to FIGS. 16A and 16B, in order to form the second contact, a hard mask pattern (not shown) which has an open portion where the second contact is to be formed may be formed on the second dielectric layer 440, and a hole TS which exposes the bottom wiring line 340 may be formed by etching the second dielectric layer 440 and the first dielectric layer 330 of the opened portion of the hard mask pattern.

To increase the degree of integration of the semiconductor memory device, the number of the stacked gate electrode layers 460 is increased, which also increases the thickness of the second dielectric layer 440 increases. Carbon from hydrofluorocarbon which is an etching compound produced during a process of etching the hole TS accumulates in the hole TS during the etching process and is polymerized to form a polymer. The accumulation of the polymer occurs adjacent to the upper sidewall of the hole TS. As the thickness of the second dielectric layer 440 increases and thus an amount of the second dielectric layer 440 to be etched in the process of etching the hole TS increases, an amount of the polymer produced during the process of etching the hole TS increases as well. The polymer is produced less in a portion where a hole pattern density is high, and more where a hole pattern density is low and the distance between adjacent holes is large. Since a second contact 480 is disposed in such a way as to stand alone, a thick polymer layer may accumulate on the upper sidewall of the hole TS during the etching process for forming the hole TS, and the entrance of the hole TS may be clogged by the polymer layer, whereby the flow of an etchant into the hole TS may be blocked. In this case, an opening failure in which the bottom portion of the hole TS is not opened may occur. As a consequence, the second contact 480 (see FIG. 4) may not be electrically coupled to the bottom wiring line 340, and the normal operation of the semiconductor memory device may become impossible. Thus, the reliability of the semiconductor memory device may degrade.

In an embodiment of the present invention, such a problem may be solved by forming additional dummy holes TU in the second dielectric layer 440 adjacent to the hole TS when forming the hole TS. As the dummy holes TU are additionally formed around the hole TS, since a hole pattern density increases in the portion where the hole TS is formed, it is possible to suppress the excessive production of the polymer. Therefore, the phenomenon in which the hole TS is clogged by the polymer is prevented and thus the etchant may be smoothly introduced into the hole TS and the hole opening failure may be prevented.

Figure 17A:
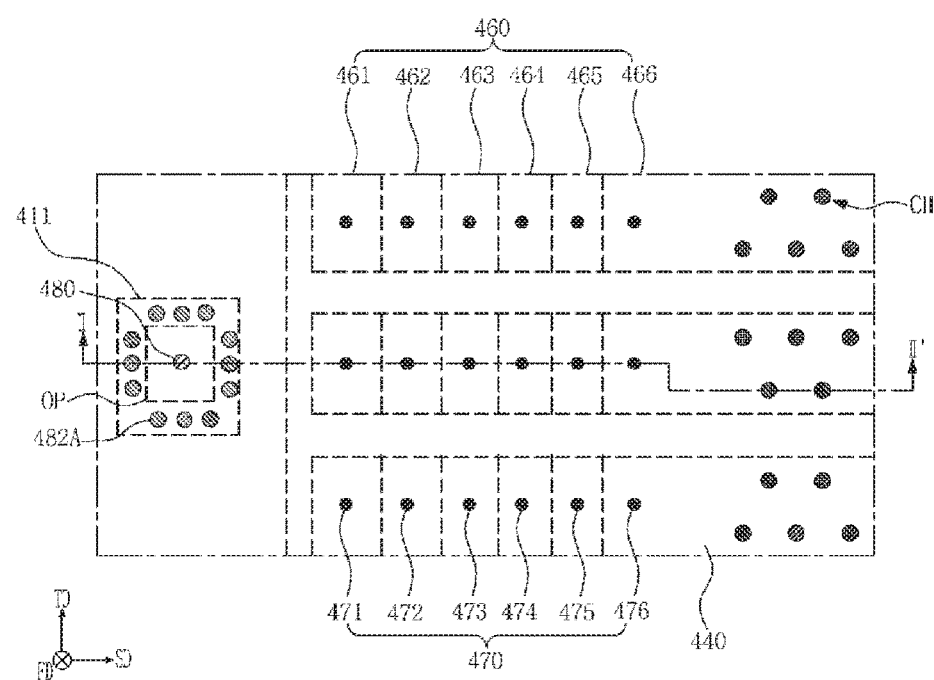
Figure 17B:
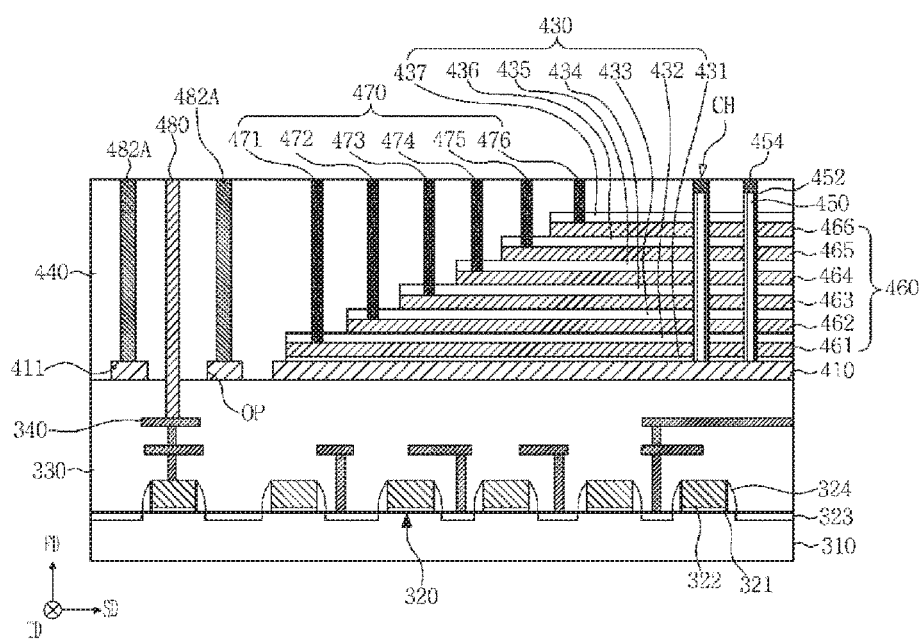

Referring to FIGS. 17A and 17B, by filling a conductive material in the hole TS and in the dummy holes TDTU, the second contact 480 and the dummy contacts 482A are formed. The second contact 480 and the dummy contacts 482A may be formed of the same material. For example, the second contact 480 and the dummy contacts 482A may be made of or include a metal or a metal silicide.

Figure 18:
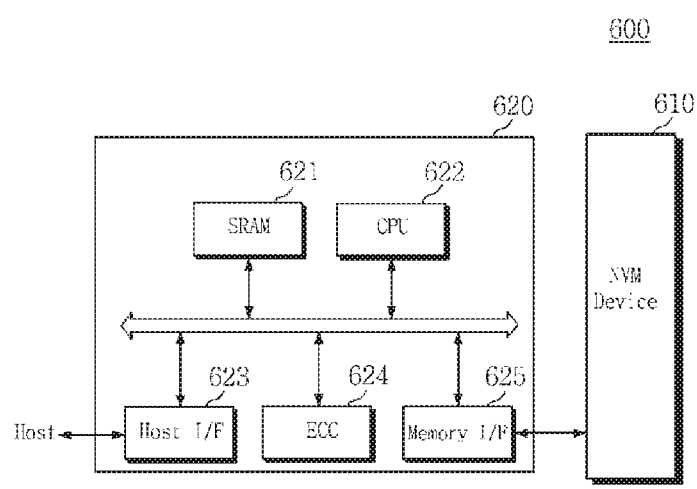
FIG. 18 is a simplified block diagram schematically illustrating a memory system including a semiconductor memory device in accordance with an embodiment of the present invention.

FIG. 18 is a simplified block diagram schematically illustrating a memory system including a memory device according to an embodiment of the present invention.

Referring to FIG. 18, the memory system 600 may include the semiconductor memory device 610 and a memory controller 620.

The semiconductor memory device 610 may be comprised the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid state disk (SSD). The memory controller 620 may include an SRAM 621, a central processing unit (CPU) 622, a host interface 623, an ECC block 624, and a memory interface 625 operatively coupled via an internal bus.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 19:
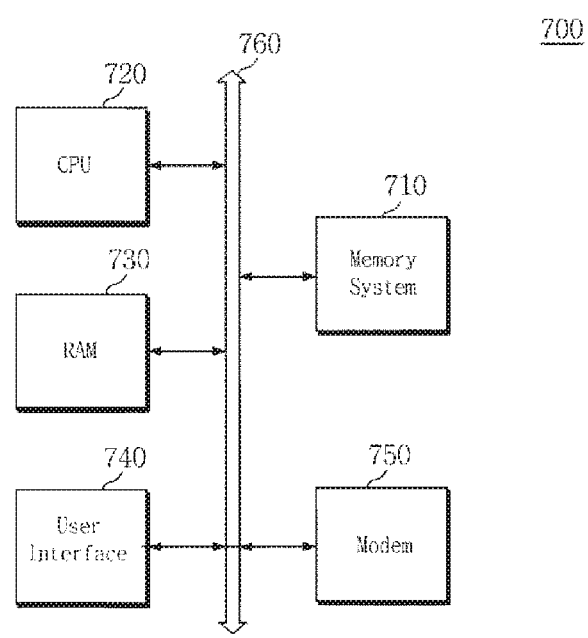
FIG. 19 is a simplified block diagram schematically illustrating a computing system including a semiconductor memory device in accordance with an embodiment of the present invention.

FIG. 19 is a simplified block diagram schematically illustrating a computing system including a memory device, according to an embodiment of the present invention.

Referring to FIG. 19, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

We also note, that it is not intended that the above-described embodiments are realized only by a device and a method, and that they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a peripheral circuit region including a first substrate, a peripheral circuit element disposed at least partially over the first substrate, a first dielectric layer covering the peripheral circuit element and a bottom wiring line disposed in the first dielectric layer and electrically coupled to the peripheral circuit element;
a cell region including a second substrate disposed over the first dielectric layer, a memory cell array disposed over the second substrate;
a second dielectric layer covering the memory cell array;
a contact coupled to the bottom wiring line by passing through the second dielectric layer and the first dielectric layer in a first direction perpendicular to a top surface of the second substrate; and
at least one dummy contact disposed adjacent to the contact in the second dielectric layer.

2. The semiconductor memory device according to claim 1, further comprising:
an etch stopper coupled to a lower end of the at least one dummy contact.

3. The semiconductor memory device according to claim 2, wherein the etch stopper is disposed over a top surface of the first dielectric layer and is coplanar with the second substrate.

4. The semiconductor memory device according to claim 2, wherein the etch stopper is formed of a material which has a different etching selectivity from the second dielectric layer.

5. The semiconductor memory device according to claim 4, wherein the second dielectric layer comprises a silicon oxide layer, and the etch stopper comprises at least one of a silicon nitride film and a polycrystalline silicon layer.

6. The semiconductor memory device according to claim 2, wherein the etch stopper is formed of the same material as the second substrate.

7. The semiconductor memory device according to claim 3, wherein the etch stopper includes an opening through which the contact passes.

8. The semiconductor memory device according to claim 1, wherein the at least one dummy contact has the same shape as the contact when viewed from the top.

9. The semiconductor memory device according to claim 1, wherein the contact and the at least one dummy contact are formed of the same material.

10. The semiconductor memory device according to claim 1, wherein the contact has a circular shape when viewed from the top, and the at least one dummy contact has a bar shape when viewed from the top.

11. The semiconductor memory device according to claim 1, wherein the contact has a circular shape when viewed from the top, and the at least one dummy contact comprises a plurality of dummy contacts arranged in a shape which surrounds the contact, when viewed from the top.

12. The semiconductor memory device according to claim 1, wherein the at least one dummy contact comprises a plurality of dummy contacts arranged in a discontinuous frame shape surrounding the contact, when viewed from the top.

13. The semiconductor memory device according to claim 1, wherein the at least one dummy contact comprises a dummy contact having a continuous frame shape surrounding the contact, when viewed from the top.

14. A semiconductor memory device comprising:
a peripheral circuit region including a first substrate, peripheral circuit elements which are disposed over the first substrate, a first dielectric layer which covers the peripheral circuit elements and a bottom wiring line which is disposed in the first dielectric layer and is electrically coupled to the peripheral circuit elements;
a cell region including a second substrate and an etch stopper which are disposed over the first dielectric layer, channel structures which extend in a first direction perpendicular to a top surface of the second substrate, a plurality of gate electrode layers and a plurality of interlayer dielectric layers which are alternately stacked over the second substrate to be adjacent to the channel structures and a second dielectric layer which covers the gate electrode layers;
a contact coupled to the bottom wiring line by passing through the second dielectric layer and the first dielectric layer in the first direction; and
a plurality of dummy contacts coupled to the etch stopper by passing through the second dielectric layer in the first direction, and disposed adjacent to the contact.

15. The semiconductor memory device according to claim 14, wherein the dummy contacts are arranged in a pattern which surrounds the contact.

16. The semiconductor memory device according to claim 14, wherein the etch stopper includes an opening through which the contact passes.

17. The semiconductor memory device according to claim 16, wherein the dummy contacts are arranged along edges of the opening.

18. The semiconductor memory device according to claim 14,
wherein the contact and the dummy contacts are formed of the same material.

19. A semiconductor memory device comprising:
a first substrate;
a peripheral circuit element disposed at least partially over the first substrate;
a first dielectric layer covering the peripheral circuit element;
a wiring line disposed in the first dielectric layer and electrically coupled to the peripheral circuit element;
a second substrate disposed over the first dielectric layer;
a second dielectric layer disposed over the second substrate;
a contact coupled to the wiring line by passing through the second dielectric layer and the first dielectric layer in a first direction perpendicular to a top surface of the second substrate; and
at least one dummy contact disposed adjacent to the contact in the second dielectric layer.

20. The semiconductor memory device according to claim 19, further comprising:
a memory cell array disposed over the second substrate inside the second dielectric layer, and
an etch stopper coupled to a lower end of the at least one dummy contact.

* * * * *